(12) United States Patent
Yang et al.

(10) Patent No.: US 11,374,123 B2
(45) Date of Patent: Jun. 28, 2022

(54) TRENCH GATE SEMICONDUCTOR DEVICE AND METHOD FOR MAKING THE SAME

(71) Applicant: Shanghai Huahong Grace Semiconductor Manufacturing Corporation, Shanghai (CN)

(72) Inventors: Jiye Yang, Shanghai (CN); Longjie Zhao, Shanghai (CN); Hao Li, Shanghai (CN)

(73) Assignee: Shanghai Huahong Grace Semiconductor Manufacturing Corporation, Shanghai (CN)

(*) Notice: Subject to any disclaimer, the term of this patent is extended or adjusted under 35 U.S.C. 154(b) by 0 days.

(21) Appl. No.: 16/997,142

(22) Filed: Aug. 19, 2020

(65) Prior Publication Data
US 2021/0119038 A1 Apr. 22, 2021

(30) Foreign Application Priority Data
Oct. 21, 2019 (CN) .......................... 201911000301.3

(51) Int. Cl.
*H01L 29/78* (2006.01)
*H01L 29/66* (2006.01)

(52) U.S. Cl.
CPC .... *H01L 29/7813* (2013.01); *H01L 29/66734* (2013.01)

(58) Field of Classification Search
None
See application file for complete search history.

(56) References Cited

U.S. PATENT DOCUMENTS

2021/0028289 A1* 1/2021 Fang .................... H01L 29/401

FOREIGN PATENT DOCUMENTS

CN 100461342 C * 2/2009

* cited by examiner

*Primary Examiner* — Robert K Carpenter
(74) *Attorney, Agent, or Firm* — Murtha Cullina LLP (57) ABSTRACT

The present disclosure discloses a trench gate semiconductor device, wherein a trench gate includes a trench formed in a semiconductor substrate, and a gate oxide layer formed on a bottom surface and a side surface of the trench; the gate oxide layer is formed by stacking a first oxide layer and a second oxide layer; the first oxide layer is a furnace tube thermal oxide layer; the second oxide layer is a PECVD oxide layer; the gate oxide layer has a thermally densified structure processed by means of RTA. The present disclosure also discloses a method for manufacturing a trench gate semiconductor device. The present disclosure can increase BVGSS of the device, without affecting the threshold voltage of the device, with simple processes and low costs.

6 Claims, 10 Drawing Sheets

TRENCH GATE SEMICONDUCTOR DEVICE AND METHOD FOR MAKING THE SAME

CROSS-REFERENCE TO RELATED APPLICATIONS

This application claims priority to Chinese patent application No. CN201911000301.3 filed on Oct. 21, 2019, and entitled "TRENCH GATE SEMICONDUCTOR DEVICE AND METHOD FOR MAKING THE SAME", the disclosure of which is incorporated herein by reference in entirety.

TECHNICAL FIELD

The present disclosure relates to the field of semiconductor integrated circuit manufacture, in particular to a trench gate semiconductor device; and the present disclosure also relates to a method for manufacturing a trench gate semiconductor device.

BACKGROUND

The gate structures of semiconductor devices are classified into two types including planar gates and trench gates. The use of the trench gate can obtain a greater current density and a smaller on-resistance, so the trench gate is often used in power devices such as DMOS devices.

The trench gate usually includes a trench, a gate oxide layer formed on the inner side surface of the trench and including a bottom surface and a side surface, and a polysilicon gate that fully fills the trench. The trench gate needs to pass through the body region, making the polysilicon gate cover the body region sideways, so that when the gate is opened, a channel can be formed on the surface of the body region covered by the side face of the polysilicon gate.

For a trench gate semiconductor device, the gate-source withstands voltage of the device, that is, the gate-source reverse breakdown voltage (BVGSS), is difficult to increase. The BVGSS is primarily related to the gate oxide layer, but simply increasing the thickness of the gate oxide layer cannot increase the BVGSS.

SUMMARY

The technical problem to be solved by the present disclosure is to provide a trench gate semiconductor device, wherein BVGSS of the device is increased. To this end, the present disclosure also provides a method for manufacturing a trench gate semiconductor device.

In order to solve the above technical problem, a trench gate of the trench gate semiconductor device provided by the present disclosure comprises a trench formed in a semiconductor substrate, and a gate oxide layer formed on a bottom surface and a side surface of the trench.

The gate oxide layer is formed by stacking a first oxide layer and a second oxide layer.

The first oxide layer is a furnace tube thermal oxide layer.

The second oxide layer is a plasma enhanced chemical vapor deposition (PECVD) oxide layer.

The gate oxide layer has a thermally densified structure processed by means of RTA.

The PECVD oxide layer formed in the trench has a characteristic that the bottom surface thickness is greater than the side surface thickness, so that the gate oxide layer has a structure with the thickness on the bottom surface of the trench greater than the thickness on the side surface of the trench.

In a further improvement, the trench gate further comprises a gate conducting material layer filling the trench where the gate oxide layer is formed.

In a further improvement, the semiconductor substrate comprises a silicon substrate.

In a further improvement, the gate conducting material layer comprises a polysilicon gate.

In a further improvement, the semiconductor device further comprises a doped body region of a second conductivity type, the body region being formed in the semiconductor substrate, and a heavily doped source region of a first conductivity type is formed on a surface of the body region; and the trench passes through the body region, the surface of the body region covered by a side surface of the gate conducting material layer is used to form a channel, the thickness of the gate oxide layer on the side surface of the trench is used to adjust a threshold voltage of the device, and the thickness of the gate oxide layer on the bottom surface of the trench is used to increase a gate-source withstand voltage of the device.

In a further improvement, the semiconductor device is a DMOS device and further comprises a heavily doped drain region of the first conductivity type, the drain region being formed on a back surface of the thinned semiconductor substrate.

In a further improvement, the thickness of the first oxide layer is 50 Å to 250 Å.

In order to solve the above technical problem, the method for manufacturing a trench gate semiconductor device provided by the present disclosure comprises steps of:

Step 1: forming a trench in a semiconductor substrate;

Step 2: forming a first oxide layer on a bottom surface and a side surface of the trench by means of a furnace tube thermal oxidation process;

Step 3: forming, by means of a PECVD process, a second oxide layer on the bottom surface and the side surface of the trench where the first oxide layer is formed, wherein a gate oxide layer is formed by stacking the first oxide layer and the second oxide layer; and the thickness of the oxide layer grown on the bottom surface of the trench by the PECVD process is greater than the thickness of the oxide layer grown on the side surface of the trench, so that the gate oxide layer has a structure with the thickness on the bottom surface of the trench greater than the thickness on the side surface of the trench; and Step 4: performing RTA processing on the gate oxide layer to thermally densify the gate oxide layer.

In a further improvement, after Step 4, the method further comprises a step of:

Step 5: filling, with a gate conducting material layer, the trench where the gate oxide layer is formed.

In a further improvement, the semiconductor substrate comprises a silicon substrate.

In a further improvement, the gate conducting material layer comprises a polysilicon gate.

In a further improvement, the method further comprises steps of:

Step 6: forming a doped body region of a second conductivity type in the silicon substrate;

wherein the trench passes through the body region, a surface of the body region covered by a side surface of the gate conducting material layer is used to form a channel, the thickness of the gate oxide layer on the side surface of the trench is used to adjust a threshold voltage of the device, and the thickness of the gate oxide layer on the bottom surface of the trench is used to increase a gate-source withstand voltage of the device; and Step 7: forming a heavily doped source region of a first conductivity type on the surface of the body region.

In a further improvement, the semiconductor device is a DMOS device, and the method further comprises a step of:

Step 8: thinning the semiconductor substrate, and forming a heavily doped drain region of the first conductivity type on a back surface of the thinned semiconductor substrate.

In a further improvement, the thickness of the first oxide layer is 50 Å to 250 Å.

In a further improvement, the semiconductor device is an N-type device, the first conductivity type is N-type, and the second conductivity type is P-type; or the semiconductor device is a P-type device, the first conductivity type is P-type, and the second conductivity type is N-type.

In the present disclosure, the process structure of the gate oxide layer of the trench gate is improved particularly. The gate oxide layer is formed by stacking the first oxide layer and the second oxide layer, wherein the first oxide layer is a furnace tube thermal oxide layer having a relatively well film-forming quality, and the second oxide layer is a PECVD oxide layer with different film-forming thicknesses on the bottom surface and the side surface of the trench, so that the gate oxide layer has a structure with the thickness on the bottom surface of the trench greater than the thickness on the side surface of the trench. In the present disclosure, the gate oxide layer is thermally densified to improve the quality of the thermally densified PECVD oxide layer. The structure of the gate oxide layer of the present disclosure has the following advantages:

Firstly, in the present disclosure, it can be ensured that the gate oxide layer on the side surface of the trench is relatively thin, so as not to affect the threshold voltage of the device and the capability of controlling the device channel.

Secondly, in the present disclosure, the relatively thick gate oxide layer on the bottom surface of the trench can be obtained, the gate oxide layer comprises the furnace tube thermal oxide layer of good quality, and the PECVD oxide layer is also subject to thermal densification processing, ensuring both the quality and the thickness of the gate oxide layer on the bottom surface of the trench, so that the bottom surface of the trench, in particular, the bottom corner of the trench, can be protected well, thereby increasing the BVGSS of the device and improving the reliability of the device.

In addition, in the present disclosure, the structure of the gate oxide layer with the thickness on the bottom surface of the trench greater than the thickness on the side surface of the trench can be formed by directly stacking the two oxide layers, without the addition of a lithography process for definition, so the present disclosure also has the advantage of a relatively low process cost.

BRIEF DESCRIPTION OF THE DRAWINGS

The present disclosure is further described in detail below with reference to the accompanying drawings and specific implementations.

DETAILED DESCRIPTION

Figure 1:
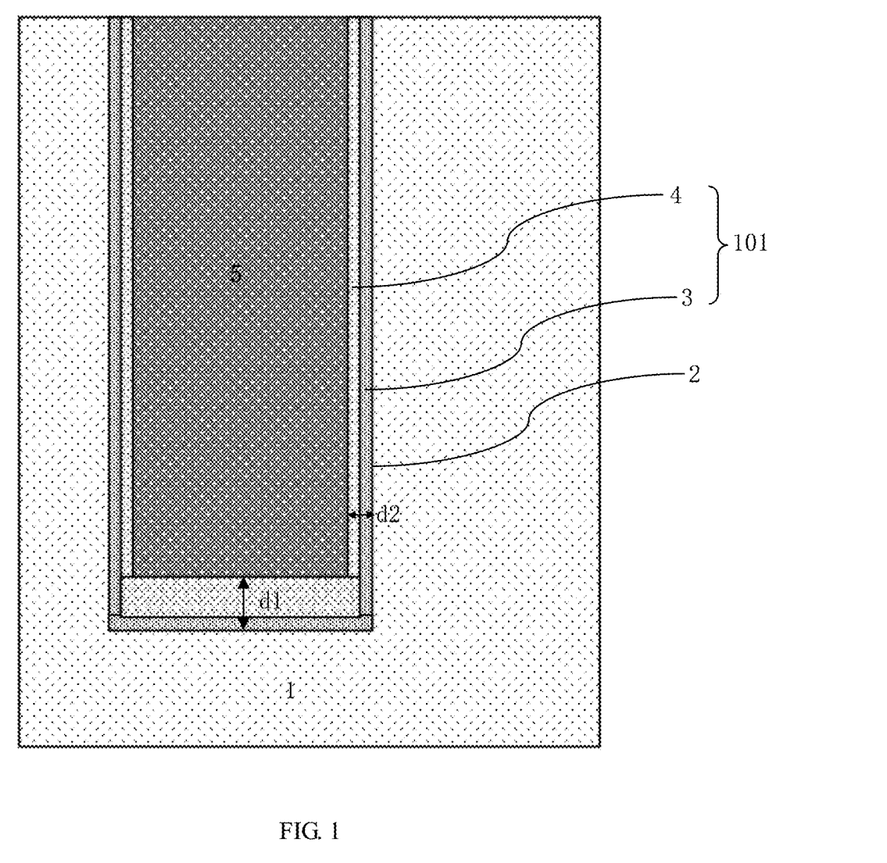
FIG. 1 is a schematic diagram of a trench gate of a trench gate semiconductor device according to embodiments of the present disclosure.

Referring to FIG. 1, FIG. 1 is a schematic diagram of a trench gate of a trench gate semiconductor device according to embodiments of the present disclosure. In the embodiments of the present disclosure, the trench gate of the trench gate semiconductor device includes a trench 2 formed in a semiconductor substrate 1, and a gate oxide layer 101 formed on a bottom surface and a side surface of the trench 2.

The gate oxide layer 101 is formed by stacking a first oxide layer 3 and a second oxide layer 4.

The first oxide layer 3 is a furnace tube thermal oxide layer.

The second oxide layer 4 is a PECVD oxide layer.

The gate oxide layer 101 has a thermally densified structure processed by means of RTA.

The PECVD oxide layer formed in the trench 2 has a characteristic that the bottom surface thickness is greater than the side surface thickness, so that the gate oxide layer 101 has a structure with the thickness d1 on the bottom surface of the trench 2 greater than the thickness d2 on the side surface of the trench 2.

The trench gate further includes a gate conducting material layer 5 filling the trench 2 where the gate oxide layer 101 is formed.

In the embodiments of the present disclosure, the semiconductor substrate 1 includes a silicon substrate. The gate conducting material layer 5 employs a polysilicon gate.

Figure 2:
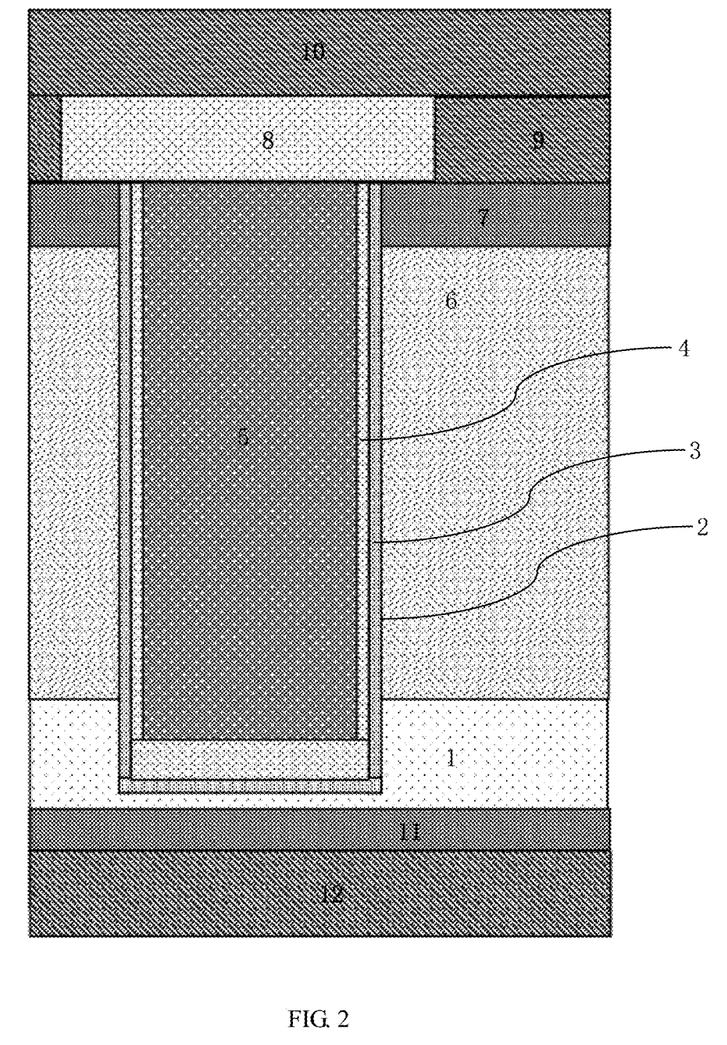
FIG. 2 is a schematic diagram of a device structure of the trench gate semiconductor device employing the trench gate shown by FIG. 1 according to the embodiments of the present disclosure.

The semiconductor device is a DMOS device, referring to FIG. 2, which is a schematic diagram of a device structure of the trench gate semiconductor device employing the trench gate shown by FIG. 1 according to the embodiments of the present disclosure. The semiconductor device further includes a doped body region 6 of a second conductivity type, the body region 6 being formed in the semiconductor substrate 1, and a heavily doped source region 7 of a first conductivity type is formed on a surface of the body region 6. The trench 2 passes through the body region 6, the surface of the body region 6 covered by a side surface of the gate conducting material layer 5 is used to form a channel, the thickness of the gate oxide layer 101 on the side surface of the trench 2 is used to adjust a threshold voltage of the device, and the thickness of the gate oxide layer 101 on the bottom surface of the trench 2 is used to increase a gate-source withstand voltage of the device.

The thickness of the first oxide layer 3 is 50 Å to 250 Å.

The semiconductor device further includes a heavily doped drain region 11 of the first conductivity type, the drain region 11 being formed on a back surface of the thinned semiconductor substrate 1.

The semiconductor device further includes an interlayer film 8, a contact hole 9, and a front metal layer 10. The contact hole 9 passes through the interlayer film 8, the source region 7 is connected to a source consisting of the front metal layer 10 by means of the corresponding contact hole 9 at the top, and the gate conducting material layer 5 is connected to a gate consisting of the front metal layer 10 by means of the corresponding contact hole 9.

A drain consisting of a back metal layer 12 is formed on the back surface of the drain region 11.

In the embodiments of the present disclosure, the semiconductor device is an N-type device, the first conductivity type is N-type, and the second conductivity type is P-type; or in other embodiments, the semiconductor device is a P-type device, the first conductivity type is P-type, and the second conductivity type is N-type.

In the embodiments of the present disclosure, the process structure of the gate oxide layer 101 of the trench gate is improved particularly. The gate oxide layer 101 configured to be formed by stacking the first oxide layer 3 and the second oxide layer 4, wherein the first oxide layer 3 is a furnace tube thermal oxide layer having a relatively well film-forming quality, and the second oxide layer 4 is a PECVD oxide layer with different film-forming thicknesses on the bottom surface and the side surface of the trench 2, so that the gate oxide layer 101 has a structure with the thickness on the bottom surface of the trench 2 greater than the thickness on the side surface of the trench 2. In the embodiments of the present disclosure, the gate oxide layer 101 is thermally densified to improve the quality of the thermally densified PECVD oxide layer. The structure of the gate oxide layer 101 of the embodiments of the present disclosure has the following advantages:

Firstly, in the embodiments of the present disclosure, it can be ensured that the gate oxide layer 101 on the side surface of the trench 2 is relatively thin, so as not to affect the threshold voltage of the device and the capability of controlling the device channel.

Secondly, in the embodiments of the present disclosure, the relatively thick gate oxide layer 101 on the bottom surface of the trench 2 can be obtained, the gate oxide layer 101 includes the furnace tube thermal oxide layer of good quality, and the PECVD oxide layer is also subject to thermal densification processing, ensuring both the quality and the thickness of the gate oxide layer 101 on the bottom surface of the trench 2, so that the bottom surface of the trench 2, in particular, the bottom corner of the trench 2, can be protected well, thereby increasing the BVGSS of the device and improving the reliability of the device.

In addition, in the embodiments of the present disclosure, the structure of the gate oxide layer 101 with the thickness d1 on the bottom surface of the trench 2 greater than the thickness d2 on the side surface of the trench 2 can be formed by directly stacking the two oxide layers, without the addition of a lithography process for definition, so the embodiments of the present disclosure also have the advantage of a relatively low process cost.

Figure 4A:
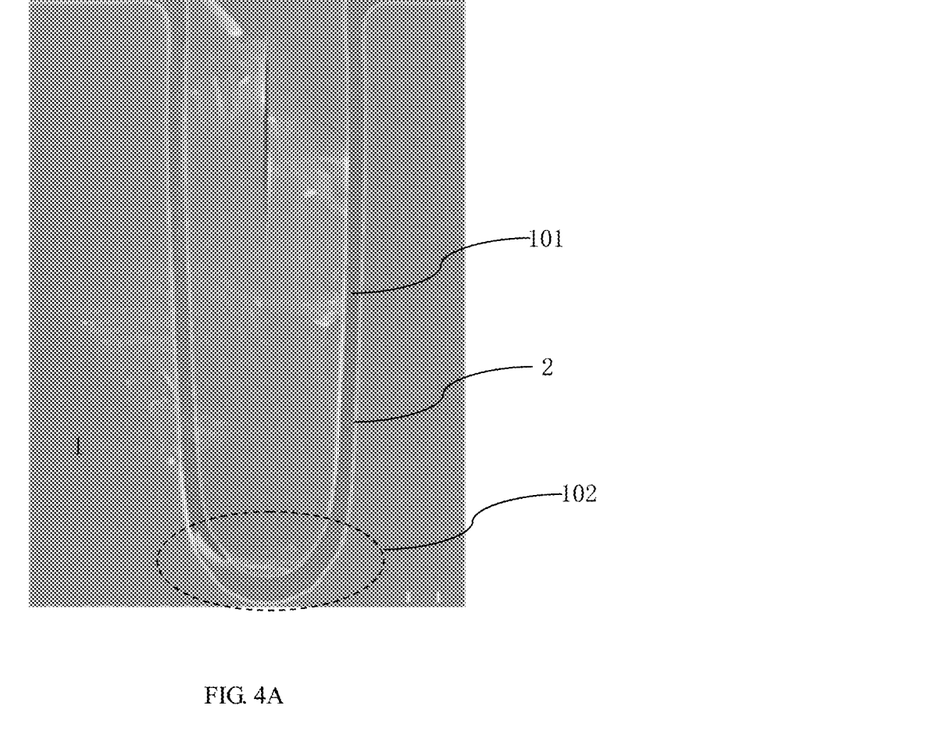
FIG. 4A is an SEM photograph of the trench gate of the trench gate semiconductor device according to the embodiments of the present disclosure.
Figure 4B:
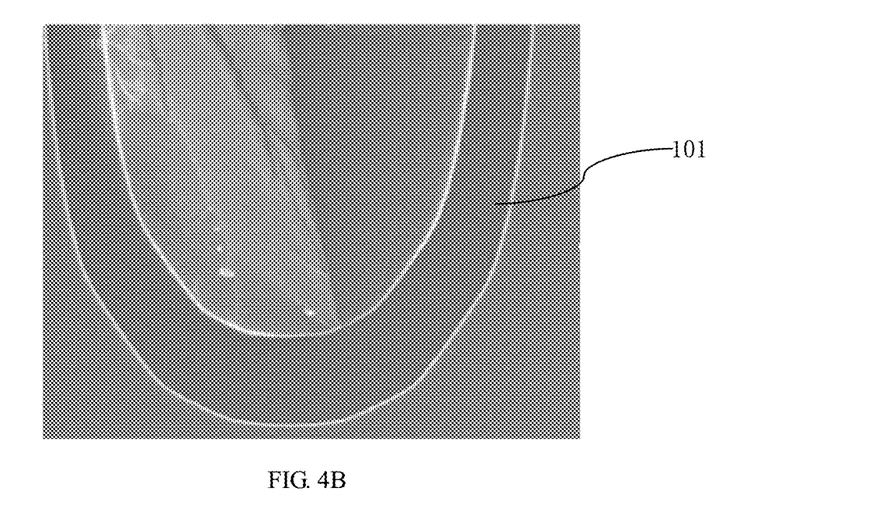
FIG. 4B is an enlarged drawing of the bottom of the trench gate in FIG. 4A.

Referring to FIG. 4A, FIG. 4A is an SEM photograph of the trench gate of the trench gate semiconductor device according to the embodiments of the present disclosure; and FIG. 4B is an enlarged drawing of the bottom of the trench gate in FIG. 4A. It can be found from measurement that the thickness d1 of the gate oxide layer 101 on the bottom surface of the trench 2 is 1760 Å, and the thickness d2 of the gate oxide layer 101 on the side surface of the trench 2 is 1100 Å, so d1 is greater than d2; and the thickness of the gate oxide layer 101 at the corner of the trench 2 reaches 1320 Å. The corner of the trench 2 is the weakest part of the trench gate, and an increase in the thickness of the gate oxide layer 101 at the corner of the trench 2 can improve the reliability of the device.

Figure 5:
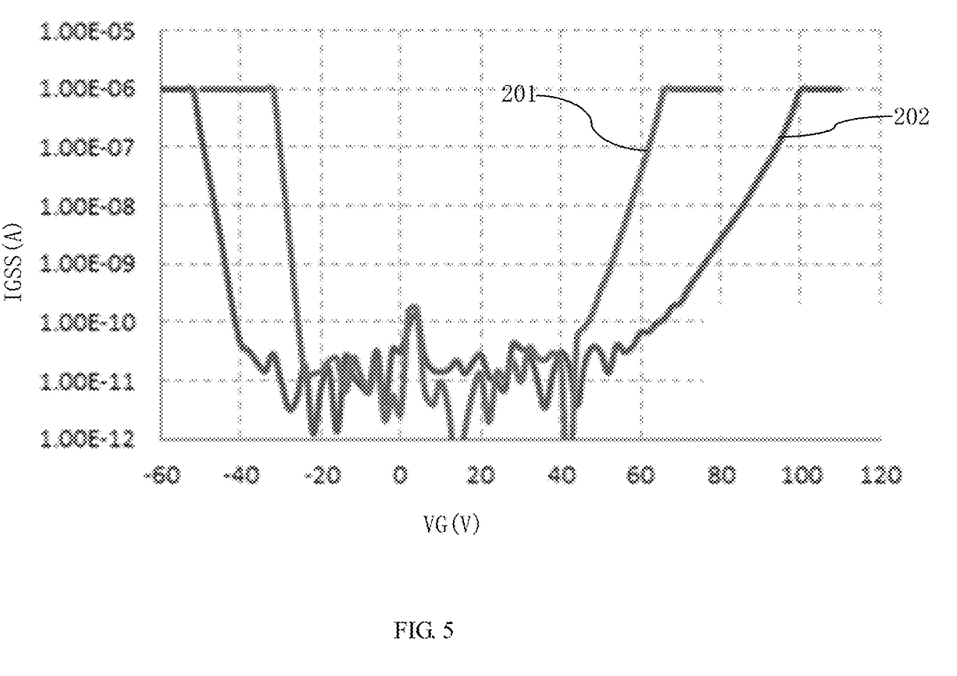
FIG. 5 is comparison diagram of a BVGSS curve of the trench gate semiconductor device and a BVGSS curve of an existing device according to the embodiments of the present disclosure.

Referring to FIG. 5, FIG. 5 is comparison diagram of a BVGSS curve of the trench gate semiconductor device and a BVGSS curve of an existing device according to the embodiments of the present disclosure. Curve 201 is the BVGSS curve of the existing device, curve 202 is the BVGSS curve of the trench gate semiconductor device of the embodiments of the present disclosure, VG represents a gate voltage of the device, and IGSS represents a leakage current between the gate and the source of the device. A sudden increase in the IGSS represents a gate-source breakdown, with a corresponding voltage BVGSS. It can be seen that the BVGSS of curve 202 is increased.

Referring to FIGS. 3A-3F, FIGS. 3A-3F are schematic diagrams of device structures in steps of a method for manufacturing a trench gate semiconductor device according to the embodiments of the present disclosure.

Figure 3A:
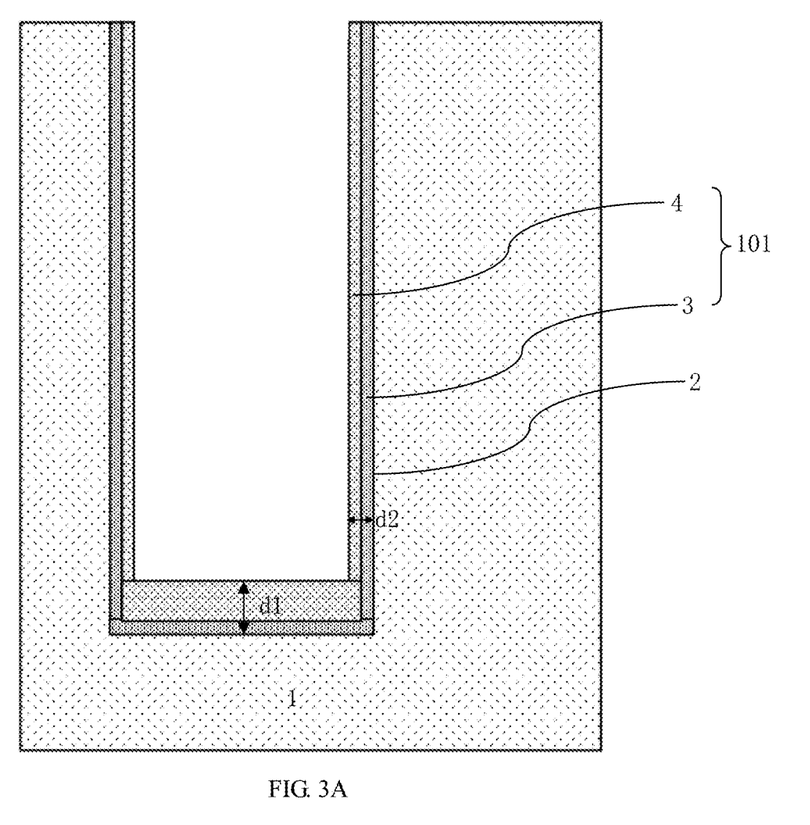
FIGS. 3A-3F are schematic diagrams of device structures in steps of a method for manufacturing a trench gate semiconductor device according to the embodiments of the present disclosure.

Step 1: referring to FIG. 3A, a trench 2 is formed in a semiconductor substrate 1.

The semiconductor substrate includes a silicon substrate.

Step 2: referring to FIG. 3A, a first oxide layer 3 is formed on a bottom surface and a side surface of the trench 2 by means of a furnace tube thermal oxidation process.

Step 3: referring to FIG. 3A, a second oxide layer 4 is formed, by means of a PECVD process, on the bottom surface and the side surface of the trench 2 where the first oxide layer 3 is formed, wherein a gate oxide layer 101 is formed by stacking the first oxide layer 3 and the second oxide layer 4.

The thickness of the oxide layer grown on the bottom surface of the trench 2 by the PECVD process is greater than the thickness of the oxide layer grown on the side surface of the trench 2, so that the gate oxide layer 101 has a structure with the thickness d1 on the bottom surface of the trench 2 greater than the thickness d2 on the side surface of the trench 2.

Step 4: referring to FIG. 3A, RTA processing is performed on the gate oxide layer 101 to thermally densify the gate oxide layer 101.

Figure 3B:
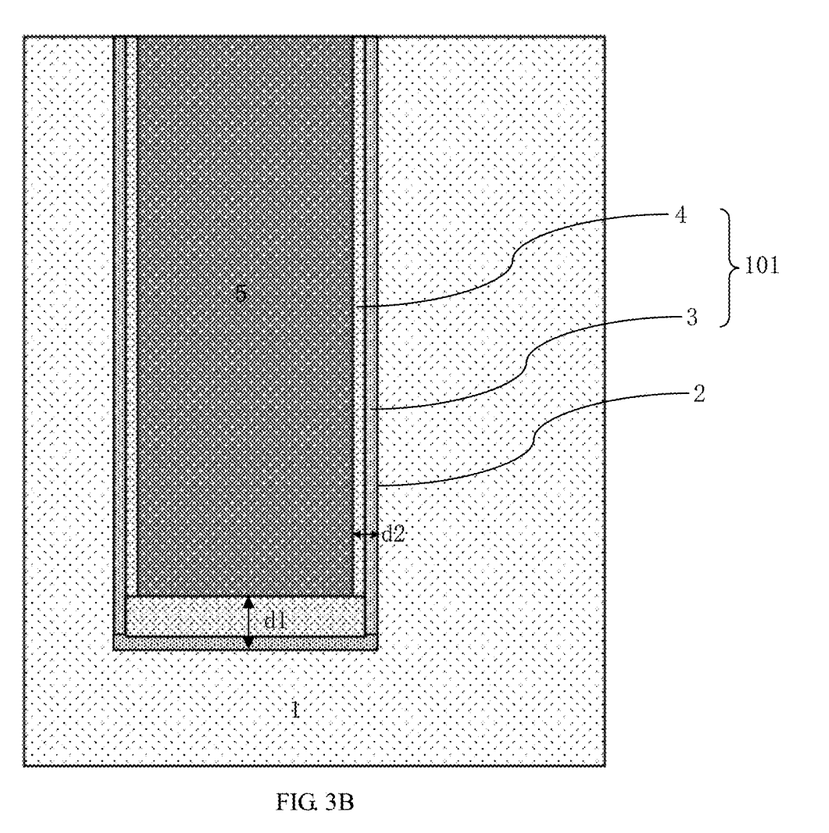

Step 5: referring to FIG. 3B, the trench 2 where the gate oxide layer 101 is formed is filled with a gate conducting material layer 5.

The gate conducting material layer 5 includes a polysilicon gate.

Figure 3C:
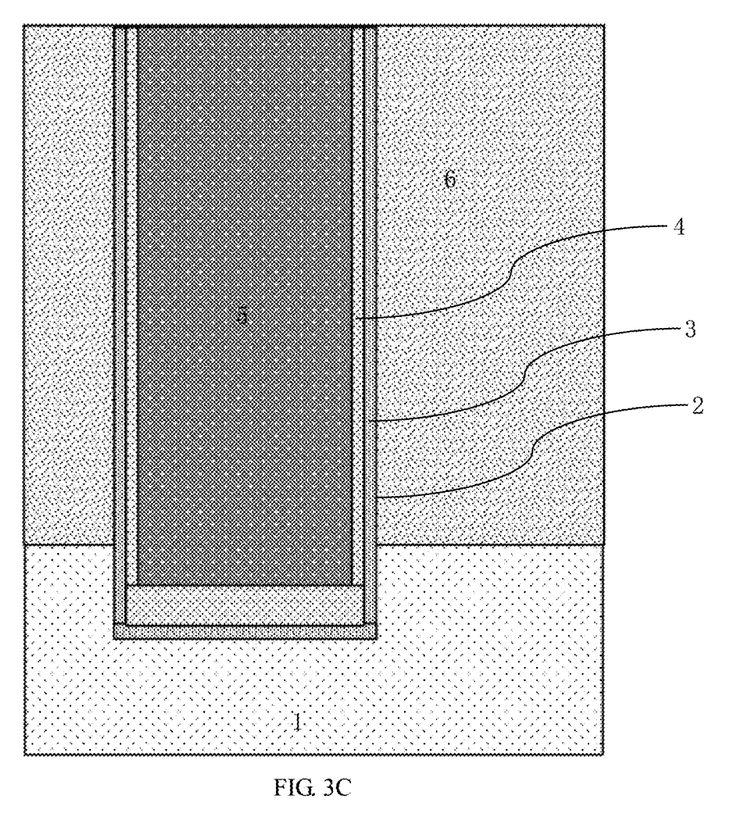

The method further includes the following steps:

Step 6: referring to FIG. 3C, a doped body region 6 of a second conductivity type is formed in the silicon substrate 1. The trench 2 passes through the body region 6, a surface of the body region 6 covered by a side surface of the gate conducting material layer 5 is used to form a channel, the thickness of the gate oxide layer 101 on the side surface of the trench 2 is used to adjust a threshold voltage of the device, and the thickness of the gate oxide layer 101 on the bottom surface of the trench 2 is used to increase a gate-source withstand voltage of the device.

Figure 3D:
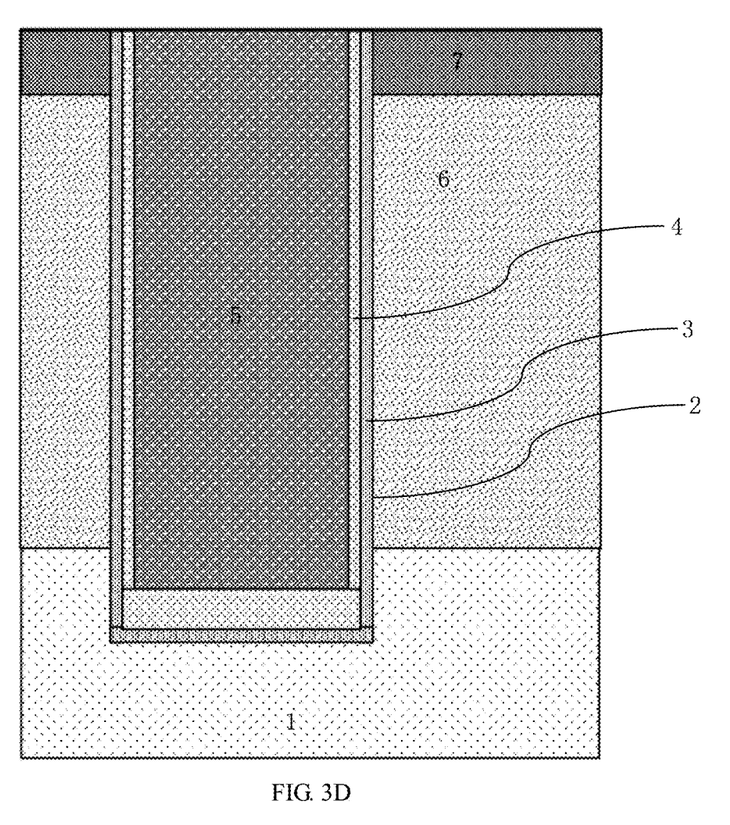

Step 7: referring to FIG. 3D, a heavily doped source region 7 of a first conductivity type is formed on the surface of the body region 6.

Figure 3E:
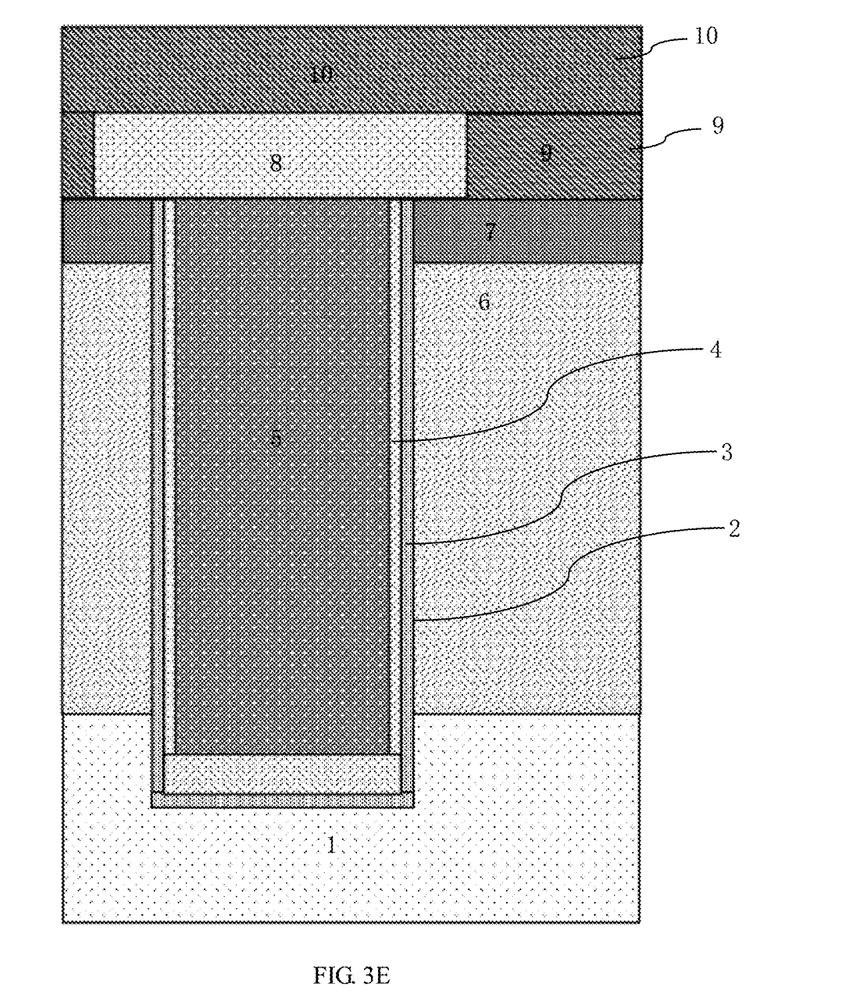

The method further includes the following front processes:

An interlayer film 8 is formed.

A contact hole 9 passing through the interlayer film 8 is formed.

A front metal layer 10 is formed, and the front metal layer 10 is patterned to form a source and a gate. The source region 7 is connected to the source consisting of the front metal layer 10 by means of the corresponding contact hole 9 at the top, and the gate conducting material layer 5 is connected to the gate consisting of the front metal layer 10 by means of the corresponding contact hole 9.

Figure 3F:
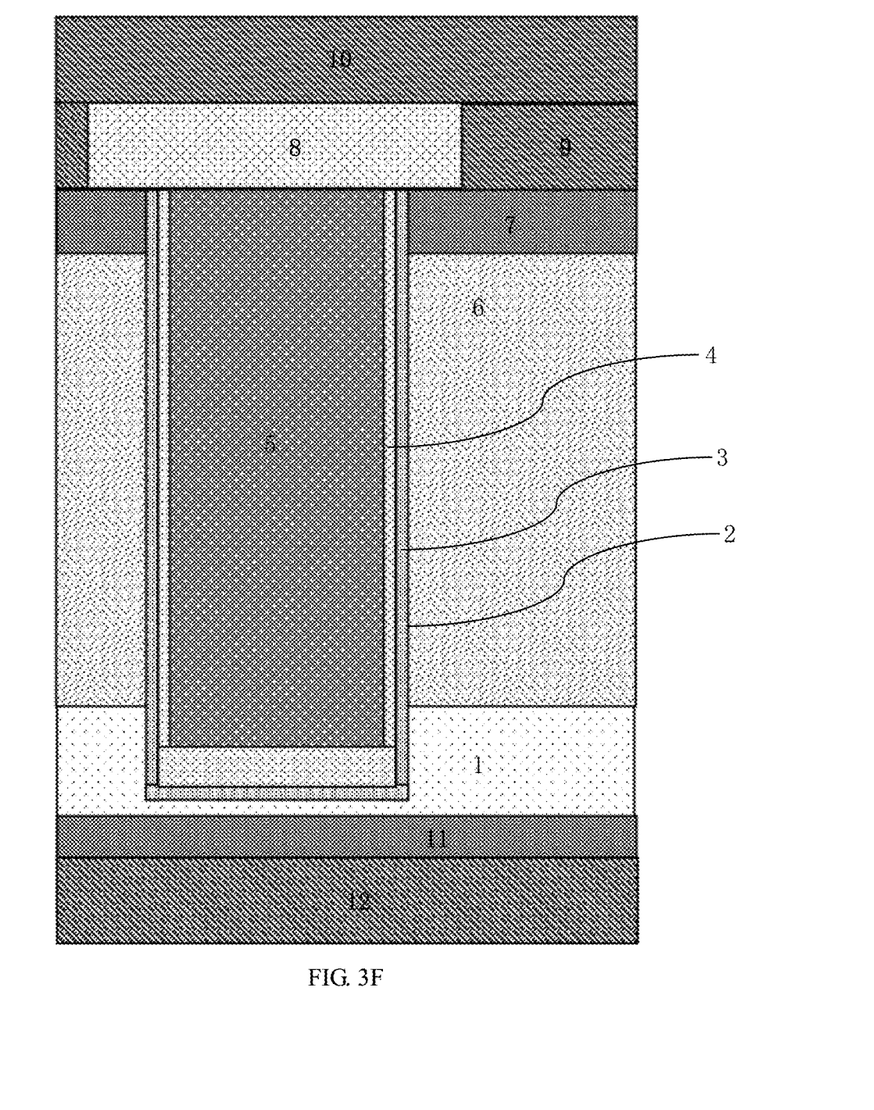

The semiconductor device is a DMOS device, and the method further includes a step of:

Step 8: the semiconductor substrate 1 is thinned, and a heavily doped drain region 11 of the first conductivity type is formed on a back surface of the thinned semiconductor substrate 1.

A back metal layer 12 is formed, and a drain consists of the back metal layer 12.

The present disclosure has been described in detail above by using specific embodiments, but the description is not intended to limit the present disclosure. Without departing from the principles of the present disclosure, those skilled in the art could also make many variations and improvements, which should also be regarded as the protection scope of the present disclosure.

What is claimed is:

1. A method for manufacturing a trench gate semiconductor device, comprising steps of:

Step 1: forming a trench in a semiconductor substrate;

Step 2: forming a first oxide layer on a bottom surface and a side surface of the trench by means of a furnace tube thermal oxidation process;

Step 3: forming, by means of a PECVD process, a second oxide layer on the bottom surface and the side surface of the trench where the first oxide layer is formed, wherein a gate oxide layer is formed by stacking the first oxide layer and the second oxide layer; and the thickness of the oxide layer grown on the bottom surface of the trench by the PECVD process is greater than the thickness of the oxide layer grown on the side surface of the trench by the PECVD process, so that the gate oxide layer has a structure with the thickness on the bottom surface of the trench greater than the thickness on the side surface of the trench;

Step 4: performing RTA processing on the gate oxide layer to thermally densify the gate oxide layer;

Step 5: filling, with a gate conducting material layer, the trench where the gate oxide layer is formed;

Step 6: forming a doped body region of a second conductivity type in the silicon substrate;

wherein the trench passes through the body region, a surface of the body region covered by a side surface of the gate conducting material layer is used to form a channel, the thickness of the gate oxide layer on the side surface of the trench is used to adjust a threshold voltage of the device, and the thickness of the gate oxide layer on the bottom surface of the trench is used to increase a gate-source withstand voltage of the device; and Step 7: forming a heavily doped source region of a first conductivity type on the surface of the body region.

2. The method for manufacturing a trench gate semiconductor device according to claim 1, wherein the semiconductor substrate comprises a silicon substrate.

3. The method for manufacturing a trench gate semiconductor device according to claim 2, wherein the gate conducting material layer comprises a polysilicon gate.

4. The method for manufacturing a trench gate semiconductor device according to claim 1, wherein the semiconductor device is a DMOS device, and the method further comprises a step of:

Step 8: thinning the semiconductor substrate and forming a heavily doped drain region of the first conductivity type on a back surface of the thinned semiconductor substrate.

5. The method for manufacturing a trench gate semiconductor device according to claim 4, wherein the semiconductor device is an N-type device, the first conductivity type is N-type, and the second conductivity type is P-type; or the semiconductor device is a P-type device, the first conductivity type is P-type, and the second conductivity type is N-type.

6. The method for manufacturing a trench gate semiconductor device according to claim 1, wherein the thickness of the first oxide layer is 50 Å to 250 Å.

* * * * *